United States Patent
Wang et al.

(10) Patent No.: US 10,916,726 B2
(45) Date of Patent: Feb. 9, 2021

(54) CRACK EXTENSION BLOCKING STRUCTURE, DISPLAY PANEL, DISPLAY APPARATUS, AND PRODUCTION METHOD THEREOF

(71) Applicants: BOE Technology Group Co., Ltd., Beijing (CN); Chengdu BOE Optoelectronics Technology Co., Ltd., Chengdu (CN)

(72) Inventors: Wei Wang, Beijing (CN); Peng Huang, Beijing (CN); Jingkai Ni, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 208 days.

(21) Appl. No.: 16/145,376

(22) Filed: Sep. 28, 2018

(65) Prior Publication Data
US 2019/0273218 A1  Sep. 5, 2019

(30) Foreign Application Priority Data
Mar. 2, 2018  (CN) .......................... 2018 1 0173411

(51) Int. Cl.
*H01L 51/56* (2006.01)
*H01L 51/52* (2006.01)
*H01L 27/32* (2006.01)

(52) U.S. Cl.
CPC ...... *H01L 51/5253* (2013.01); *H01L 27/3244* (2013.01); *H01L 51/524* (2013.01);
(Continued)

(58) Field of Classification Search
CPC ..... H01L 51/52; H01L 51/524; H01L 51/525; H01L 51/5253; H01L 51/5256;
(Continued)

(56) References Cited

U.S. PATENT DOCUMENTS 9,190,630 B2   11/2015  Kim et al.
2014/0131683 A1* 5/2014  Kim .................... H01L 51/5253
                                               257/40

FOREIGN PATENT DOCUMENTS

| CN | 103811530 A | 5/2014 |
| CN | 107180923 A | 9/2017 |
| CN | 206849868 U | 1/2018 |

OTHER PUBLICATIONS

First Office Action, including Search Report, for Chinese Patent Application No. 201810173411.9, dated Jul. 11, 2017, 17 pages.

* cited by examiner

*Primary Examiner* — Monica D Harrison
(74) *Attorney, Agent, or Firm* — Westman, Champlin & Koehler, P.A.

(57) ABSTRACT

There is provided a crack extension blocking structure used for a thin film encapsulation in a display panel and a production method thereof. the crack extension blocking structure has a first side wall, a top wall, a second side wall, and a bottom wall, which are sequentially connected, wherein the bottom wall is adjacent to a substrate of the display panel, wherein the second side wall is inclined to the first side wall along a direction from the top wall to the bottom wall, and an included angle between the first side wall and the bottom wall is less than or equal to 90 degrees. There is also provided a method of producing this crack extension blocking structure from a negative photoresist by a half-tone mask. There is also provided a display panel, a production method thereof, and a display apparatus.

16 Claims, 5 Drawing Sheets

(52) U.S. Cl.
CPC .......... *H01L 51/56* (2013.01); *H01L 51/5256* (2013.01); *H01L 2251/566* (2013.01)

(58) Field of Classification Search
CPC ....... H01L 51/56; H01L 27/32; H01L 27/324; H01L 27/3244
USPC .......................................................... 257/40
See application file for complete search history.

Fig. 13

CRACK EXTENSION BLOCKING STRUCTURE, DISPLAY PANEL, DISPLAY APPARATUS, AND PRODUCTION METHOD THEREOF

CROSS-REFERENCE TO RELATED APPLICATION

This disclosure claims the priority of Chinese Patent Application No. 201810173411.9 filed on Mar. 2, 2018, which is incorporated herein in its entirety by reference.

TECHNICAL FIELD

This disclosure relates to the field of thin film encapsulated display panels, and particularly to a crack extension blocking structure, a display panel, a display apparatus, and a production method thereof.

BACKGROUND ART

At present, a display panel may be encapsulated by using a thin film encapsulation (TFE) method. When thin film encapsulation is performed by using CVD, there is inevitably a CVD Shadow (an edge of an encapsulating thin film) for the reason of characteristics of CVD and the distance between a MASK and a substrate, and the reason will result in relatively wide borders. In order to ensure that the encapsulation effect of a TFE thin film in an encapsulated zone will not be influenced by the cracking of an encapsulating thin film when laser cutting is performed at the CVD Shadow, a crack extension blocking structure is typically provided.

The research on the crack extension blocking structure is to be intensively made.

SUMMARY OF THE INVENTION

In one aspect, this disclosure provides a crack extension blocking structure used for a thin film encapsulation in a display panel, wherein
the crack extension blocking structure has a first side wall, a top wall, a second side wall, and a bottom wall, which are sequentially connected, wherein the bottom wall is adjacent to a substrate of the display panel,
wherein the second side wall is inclined to the first side wall along a direction from the top wall to the bottom wall, and an included angle between the first side wall and the bottom wall is less than or equal to 90 degrees.

Optionally, the crack extension blocking structure further comprises:
at least one support part, which is between the second side wall and the substrate and used to support the second side wall.

Optionally, the support part and the second side wall are integrally formed.

In still another aspect, this disclosure provides a display panel, comprising:
a substrate,
the crack extension blocking structure described above,
a display element, and
an encapsulating thin film,
wherein the display element is on the substrate,
the first side wall is closer to the display element than the second side wall, and
the display element and the crack extension blocking structure are encapsulated on the substrate by the encapsulating thin film.

Optionally, the display panel further comprises a barrier, which is on the substrate, between the display element and the crack extension blocking structure, and encapsulated by the encapsulating thin film.

Optionally, the encapsulating thin film is disconnected at a junction of the second side wall and the substrate.

In still another aspect, this disclosure provides a display apparatus, comprising the display panel described above.

In still another aspect, this disclosure provides a method of producing the crack extension blocking structure described above, comprising:
forming a negative photoresist layer on a substrate;
exposing the negative photoresist layer by using a half-tone mask plate, wherein the half-tone mask plate comprises an opaque zone, a fully light-transmitting zone, and a partially light-transmitting zone having a gradually changed light transmittance, so as to form an unexposed zone, a fully exposed zone, and a partially exposed zone having a gradually changed exposure amount therein in the negative photoresist layer; and
developing the negative photoresist layer to produce the crack extension blocking structure, wherein
the negative photoresist in the unexposed zone is completely removed,
the negative photoresist in the fully exposed zone is retained, and
the unexposed negative photoresist between the exposed negative photoresist and the substrate in the partially exposed zone is removed to form the second side wall of the crack extension blocking structure.

Optionally, the fully light-transmitting zone comprises a protrusion zone which protrudes into the partially light-transmitting zone, and the protrusion zone is subjected to the exposing and developing to form a support part, which is between the second side wall and the substrate and used to support the second side wall.

Optionally, the protrusion zone comprises at least one of a regular polygon, an irregular polygon, or a circular arc.

Optionally, the fully light-transmitting zone comprises an island zone in the partially light-transmitting zone, and the island zone is subjected to the exposing and developing to form a support part, which is between the second side wall and the substrate and used to support the second side wall.

Optionally, the island zone has a shape selected from at least one of a circle, a regular polygon, or an irregular polygon.

In still another aspect, this disclosure provides a method of producing a display panel, comprising:
forming a display element on a substrate,
producing the crack extension blocking structure by the method described above, and
forming an encapsulating thin film to encapsulate the display element and the crack extension blocking structure on the substrate,
wherein the first side wall of the crack extension blocking structure is closer to the display element than the second side wall.

Optionally, the encapsulating thin film is formed to be disconnected at a junction of the second side wall and the substrate.

Optionally, the encapsulating thin film is formed by CVD.

Optionally, the method further comprises
cutting the encapsulating thin film outside the second side wall.

Optionally, before forming the encapsulating thin film, the method further comprises forming a barrier between the display element and the crack extension blocking structure on the substrate.

DESCRIPTION OF EMBODIMENTS

Embodiments of this disclosure will be described in detail below. The embodiments described below are exemplary and are merely used for explaining this disclosure, and it cannot be construed to be limitations of this disclosure. Operations may be performed according to techniques or conditions commonly described in literatures in the art or according to product instructions when specific techniques or conditions are not stated in the embodiments. Any agent or instrument used, which is not denoted with any manufacturer, may be a conventional product which is commercially available.

Figure 1:
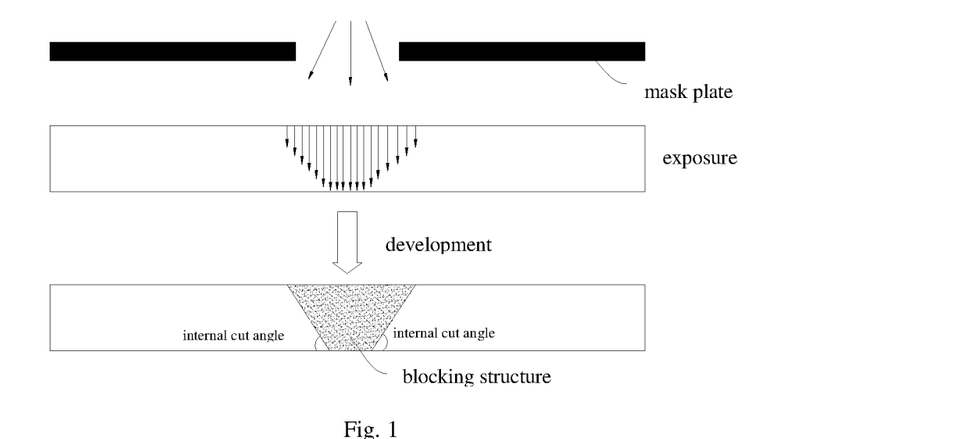
FIG. 1 is a structural flow chart of the production of a crack extension blocking structure in the related art.

In the related art, for example, a crack extension blocking structure having an inverted trapezoidal edge may be produced by a method of exposure and development using a mask plate. Crack extension blocking structures in the related art are all bilaterally internally cut, as shown in FIG. 1. "Internally cut" said herein refers to a side wall which is internally inclined from top to bottom, as shown in FIG. 1. In the case of being bilaterally internally cut as shown in FIG. 1, the internal cutting length thereof is not suitable to be excessively large, or else there will be a phenomenon of peeling of the crack extension blocking structure, while an effect of blocking will not be achieved if the internal cutting length is excessively small.

This disclosure aims to at least solve one of technical problems in the related art to some extent. To this end, objects of this disclosure are to provide a crack extension blocking structure, a display panel, a display apparatus, and a production method thereof. They may have the advantages of good encapsulation effects, narrow borders, simple production, and the like.

This disclosure is obtained by the inventor based on the following recognitions and findings.

The inventor has found that the crack extension blocking structures produced by using the related art are bilaterally internally cut (with reference to FIG. 1). Thereby, a contact area between the bottom wall of the crack extension blocking structure and a substrate is relatively small, and the adhesion is small. If the internal cutting length is relatively long, although the encapsulating thin film may be blocked, it will easily result in the peeling of the crack extension blocking structure in subsequent processes such as the deposition of the encapsulating thin film and the like, and the yield rate of encapsulation of a display panel is influenced. If the internal cutting depth is excessive short, the effect of blocking is bad and the encapsulating thin film will not be blocked, the cracking of the encapsulating thin film in a cut zone still extends to an encapsulated zone, and the encapsulation effect is influenced. Based on the above problems, the inventor has surprisingly found that if the crack extension blocking structure produced is unilaterally internally cut, i.e., a side wall away from a side of the display element is internally cut, not only it is possible to increase the adhesion between the bottom wall and the substrate and improve the stability of the crack extension blocking structure, but the internal cutting length may also be elongated. It is ensured that the internal cutting is sufficient to block the encapsulating thin film, and it is ensured that the crack extension blocking structure will not easily peel off. Therefore, the encapsulation effect is improved, and the effect of narrow borders is achieved.

Hereinafter, illustrations are made by exemplifying an OLED element as a display element in a display panel. It is to be understood that this disclosure is not limited thereto, but is suitable for various display panels using thin film encapsulation. For example, the display element may also be a quantum dot display element and the like.

In one aspect of this disclosure, this disclosure provides a method of producing a display panel. According to an embodiment of this disclosure, this method comprises: forming an OLED element on a first surface of a substrate; forming a crack extension blocking structure on the first surface, wherein the crack extension blocking structure is located on at least one side of the OLED element, and the crack extension blocking structure comprises a first side wall, a top wall, a second side wall, and a bottom wall, which are sequentially connected, and wherein the bottom wall is provided on the first surface, the first side wall is close to the OLED element, the second side wall is inclined to the first side wall along a direction from the top wall to the bottom wall; and forming an encapsulating thin film covering the OLED element and the crack extension blocking structure on a side of the OLED element away from the substrate. Thereby, the production method is simple, effective, and easy for operation, has a mature process, and is ease for industrial production. Compared to a method of producing a bilaterally internally cut crack extension blocking structure in the related art, a unilaterally internally cut crack extension blocking structure may be produced in the production method of this disclosure described above. This unilateral internal cutting is achieved by inclining a second side wall to a first side wall along a direction from a top wall to a bottom wall. Since the first side wall is not internally cut, the contact area between the bottom wall and the substrate is increased, the adhesion therebetween is increased, and the stability of the crack extension blocking structure is improved, so as to elongate the internal cutting length of the unilateral internal cutting. It is ensured that the internal cutting is sufficient to block the encapsulating thin film, and it is ensured that the crack extension blocking structure will not easily peel off. Therefore, when the crack extension blocking structure is used, encapsulating thin films on adjacent display panels on the same motherboard may be well blocked by the crack extension blocking structure. Thus, when cutting is performed, since the crack extension blocking structure has a relatively large internal cutting length, the encapsulating thin film may be blocked in a deep position of the internal cutting. In this way, the cracking of the encapsulating thin film in a cut position will not extent to the encapsulated zone. That is, it is ensured that the cracking of the encapsulating thin film in the encapsulated zone will not occur so as to improve the encapsulation effect of the thin film encapsulation of the display panel, improve the yield rate of products, and achieve a design of narrow borders of the display panel.

According to an embodiment of this disclosure, the crack extension blocking structure is produced by a half-tone mask plate and a negative photoresist, wherein the half-tone mask plate comprises: a first opaque zone, a first fully light-transmitting zone, a partially light-transmitting zone, and a second opaque zone, the first fully light-transmitting zone is located between the first opaque zone and the partially light-transmitting zone, the partially light-transmitting zone has a light transmittance which gradually increases along a direction from the second side wall to the first side wall, and second opaque zone is located on a side of the partially light-transmitting zone away from the first fully light-transmitting zone, wherein the first fully light-transmitting zone is used for producing a first part of the crack extension blocking structure, the partially light-transmitting zone is used for producing a second part of the crack extension blocking structure, and wherein the first part and the second part constitute the crack extension blocking structure, an orthographic projection of the first part on the substrate is overlapped with an orthographic projection of the bottom wall on the substrate, and an orthographic projection of the second part on the substrate is overlapped with an orthographic projection of the second side wall on the substrate.

According to an embodiment of this disclosure, the first fully light-transmitting zone comprises a rectangular zone and at least one projection part which protrudes to a side of the first opaque zone, and the projection part is used for producing a support structure of the crack extension blocking structure.

According to an embodiment of this disclosure, the shape of the projection part is selected from at least one of a regular polygon, an irregular polygon, or a circular arc.

According to an embodiment of this disclosure, the half-tone mask plate further comprises at least one second fully light-transmitting zone, the second fully light-transmitting zone is surrounded by the partially light-transmitting zone to form the support structure.

According to an embodiment of this disclosure, the shape of the second fully light-transmitting zone is selected from at least one of a circle, a regular polygon, or an irregular polygon.

According to an embodiment of this disclosure, the method of producing a display panel further comprises: a step of forming a barrier on the first surface, wherein the barrier is located between the OLED element and the crack extension blocking structure and between the first surface and the encapsulating thin film.

According to an embodiment of this disclosure, the step of producing the crack extension blocking structure comprises: applying a negative photoresist, wherein the negative photoresist is provided on the first surface and covers the OLED element; and performing treatments of exposure and development to the negative photoresist by using a half-tone mask plate, so as to obtain the crack extension blocking structure.

In another aspect of this disclosure, this disclosure provides a display panel. According to an embodiment of this disclosure, this display panel comprises: a substrate; an OLED element, wherein the OLED element is provided on a first surface of the substrate; a crack extension blocking structure, wherein the crack extension blocking structure is provided on the first surface and located on at least one side of the OLED element, and the crack extension blocking structure comprises a first side wall, a top wall, a second side wall, and a bottom wall, which are sequentially connected, and wherein the bottom wall is provided on the first surface, the first side wall is close to the OLED element, the second side wall is inclined to the first side wall along a direction from the top wall to the bottom wall; and an encapsulating thin film, wherein the encapsulating thin film is provided on a side of the OLED element away from the substrate and covers the OLED element and the crack extension blocking structure. The inventor has found that compared to bilaterally internally cut crack extension blocking structures in the related art, the crack extension blocking structure of this disclosure is unilaterally internally cut, which is achieved by inclining a second side wall to a first side wall along a direction from a top wall to a bottom wall. Since the first side wall is not internally cut, the contact area between the bottom wall and the substrate is increased, the adhesion therebetween is increased, and the stability of the crack extension blocking structure is improved, so as to elongate the internal cutting length of the unilateral internal cutting. It is ensured that the internal cutting is sufficient to block the encapsulating thin film, and it is ensured that the crack extension blocking structure will not easily peel off. Therefore, when the crack extension blocking structure is used, encapsulating thin films on adjacent display panels on the same motherboard may be well blocked by the crack extension blocking structure. Thus, when cutting is performed, since the crack extension blocking structure has a relatively large internal cutting length, the encapsulating thin film may be blocked in a deep position of the internal cutting. In this way, the cracking of the encapsulating thin film in a cut position will not extent to the encapsulated zone. That is, it is ensured that the cracking of the encapsulating thin film in the encapsulated zone will not occur so as to improve the encapsulation effect of the thin film encapsulation of the display panel, improve the yield rate of products, and achieve a design of narrow borders of the display panel.

According to an embodiment of this disclosure, an included angle between the first side wall and the bottom wall is less than or equal to 90 degrees.

According to an embodiment of this disclosure, the crack extension blocking structure further comprises: at least one support structure, wherein the support structure is provided between the second side wall and the first surface and is used for supporting the crack extension blocking structure.

According to an embodiment of this disclosure, the support structure and the crack extension blocking structure are integrally formed.

According to an embodiment of this disclosure, the display panel further comprises a barrier, wherein the barrier is provided on the first surface, and is located between the OLED element and the crack extension blocking structure and between the first surface and the encapsulating thin film.

In still another aspect of this disclosure, this disclosure provides a display apparatus. According to an embodiment of this disclosure, this display apparatus comprises the display panel described previously. Thereby, this display panel has a high utilization performance, a good reliability, a long useful life, and a strong market competitiveness. It can be understood by a person skilled in the art that this display apparatus has all characteristics and advantages of the display panel described previously. Verbose words are omitted herein.

In one aspect, this disclosure provides a crack extension blocking structure used for a thin film encapsulation in a display panel, wherein
  the crack extension blocking structure has a first side wall, a top wall, a second side wall, and a bottom wall, which are sequentially connected, wherein the bottom wall is adjacent to a substrate of the display panel,
  wherein the second side wall is inclined to the first side wall along a direction from the top wall to the bottom wall, and an included angle between the first side wall and the bottom wall is less than or equal to 90 degrees.

The crack extension blocking structure of this disclosure is a unilaterally internally cut structure. Therefore, compared to FIG. 1 of the related art, the internal cutting on one side may be omitted. The width of this omitted internal cutting may be used to form a wider bottom wall to improve the bondability between the crack extension blocking structure and the substrate, and may also be used to allow the remaining internal cutting to be more inclined to improve the performance of crack extension blocking.

The substrate of display panel is further used for bearing a display element and the like. With respect to the crack extension blocking structure, the first side wall may be close to the display element in the display panel and the second side wall may be close to the edge of the display panel. Thus, when the edge of the display panel is cut after thin film encapsulation, cracks generated will not transcend the crack extension blocking structure and extends to the display element due to the presence of the crack extension blocking structure, so that good sealing is ensured.

Each wall of the crack extension blocking structure described above is observed from a section. The crack extension blocking structure may be a strip-shaped member, for example a strip-shaped member parallel to the edge of the display panel.

Optionally, the crack extension blocking structure further comprises:
  at least one support part, which is between the second side wall and the substrate and used to support the second side wall.

In order to allow the internally cut second side wall to be more stable upon pressing, the support part described above may be provided.

Optionally, the support part and the second side wall are integrally formed.

The support part, which is integrally formed with the second side wall, is firmly bonded to the second side wall and will be easily produced.

In still another aspect, this disclosure provides a display panel, comprising:
  a substrate,
  the crack extension blocking structure described above,
  a display element, and
  an encapsulating thin film,
  wherein the display element is on the substrate,
  the first side wall is closer to the display element than the second side wall, and
  the display element and the crack extension blocking structure are encapsulated on the substrate by the encapsulating thin film.

As described above, with respect to the crack extension blocking structure, the first side wall is close to the display element in the display panel and the second side wall may be close to the edge of the display panel. Thus, when the edge of the display panel is cut after thin film encapsulation, cracks generated will not transcend the crack extension blocking structure and extends to the display element due to the presence of the crack extension blocking structure, so that good sealing is ensured.

The encapsulating thin film overlies the display element to allow the display element to be sandwiched between the encapsulating thin film and the substrate and encapsulated. The crack extension blocking structure is also encapsulated on the substrate by the encapsulating thin film. However, as described below, the crack extension blocking structure may not be completely encapsulated by the encapsulating thin film on the second side wall. The top wall and the first side wall may be encapsulated by the encapsulating thin film. This is not limited in this disclosure, as long as the extension of cracks in a direction from the second side wall to the first side wall can be prevented.

Optionally, the display panel further comprises a barrier, which is on the substrate, between the display element and the crack extension blocking structure, and encapsulated by the encapsulating thin film.

The barrier is used for improving the encapsulation effect, elongating the path by which water vapor and oxygen enters the display panel, and elongating the useful life. Therefore, it should be provided between the crack extension blocking structure and the device.

Optionally, the encapsulating thin film is disconnected at a junction of the second side wall and the substrate.

When the encapsulating thin film is disconnected at the junction described above, the extension of cracks from the outside of the second side wall to the device such as a display element and the like in the inside the first side wall is completely prevented. The encapsulating thin film may be not only disconnected at the junction described above. For example, the lower part of the second side wall may be not covered by the encapsulating thin film. When the encapsulating thin film is disconnected in other positions, there may be an encapsulating thin film at the junction described above.

In still another aspect, this disclosure provides a display apparatus, comprising the display panel described above.

This display apparatus has a good encapsulation effect so as to have a better service life and the like.

In still another aspect, this disclosure provides a method of producing the crack extension blocking structure described above, comprising:
  forming a negative photoresist layer on a substrate;
  exposing the negative photoresist layer by using a half-tone mask plate, wherein the half-tone mask plate comprises an opaque zone, a fully light-transmitting zone, and a partially light-transmitting zone having a gradually changed light transmittance, so as to form an unexposed zone, a fully exposed zone, and a partially exposed zone having a gradually changed exposure amount therein in the negative photoresist layer; and
  developing the negative photoresist layer to produce the crack extension blocking structure, wherein
    the negative photoresist in the unexposed zone is completely removed, the negative photoresist in the fully exposed zone is retained, and the unexposed negative photoresist between the exposed negative photoresist and the substrate in the partially exposed zone is removed to form the second side wall of the crack extension blocking structure.

The crack extension blocking structure of this disclosure may be formed by various methods. It is convenient to use a negative photoresist as a material of the crack extension blocking structure and use a half-tone mask plate for patterning.

The light transmittance of the partially light-transmitting zone is gradually changed. The specific light transmittance of the partially light-transmitting zone may be designed by a person skilled in the art according to the second side wall to be formed. Typically, the negative photoresist layer retained after development is relatively thick in a part having a relatively large light transmittance, while the negative photoresist layer retained after development is relatively thin in a part having a relatively small light transmittance. The thickness retained is from the top wall. Therefore, for example, the light transmittance gradually decreases from a position close to the fully light-transmitting zone to a position away from the fully light-transmitting zone so as to form a internally cut side wall after development.

Optionally, the fully light-transmitting zone comprises a protrusion zone which protrudes into the partially light-transmitting zone, and the protrusion zone is subjected to the exposing and developing to form a support part, which is between the second side wall and the substrate and used to support the second side wall. The protrusion zone may also be referred to as a projection part. The part of the fully light-transmitting zone excluding the protrusion zone may be a rectangular zone. However, it may also have other shapes. By setting the shape of the fully light-transmitting zone, a support part, or referred to as a support structure, integrally formed with the second side wall may be formed by exposure and development.

Optionally, the protrusion zone comprises at least one of a regular polygon, an irregular polygon, or a circular arc. Mask plates having protrusion zones of these shapes may be produced easily.

Optionally, the fully light-transmitting zone comprises an island zone in the partially light-transmitting zone, and the island zone is subjected to the exposing and developing to forma support part, which is between the second side wall and the substrate and used to support the second side wall. The island zone may also be referred to as the second fully light-transmitting zone so as to be distinguished from the first fully light-transmitting zone for forming a part having a bottom wall.

Optionally, the island zone has a shape selected from at least one of a circle, a regular polygon, or an irregular polygon. Mask plates having island zones of these shapes may be produced easily.

In still another aspect, this disclosure provides a method of producing a display panel, comprising:
forming a display element on a substrate,
producing the crack extension blocking structure by the method described above, and
forming an encapsulating thin film to encapsulate the display element and the crack extension blocking structure on the substrate,
wherein the first side wall of the crack extension blocking structure is closer to the display element than the second side wall.

Optionally, the encapsulating thin film is formed to be disconnected at a junction of the second side wall and the substrate.

The disconnection of the encapsulating thin film at the junction described above may ensure that the extension of cracks will not continue.

Optionally, the encapsulating thin film is formed by CVD.

When an encapsulating thin film is formed by using a CVD method, a disconnected encapsulating thin film may be naturally formed near an internally cut angle.

Optionally, the method further comprises
cutting the encapsulating thin film outside the second side wall.

With respect to the display panel of this disclosure, the extension of cracks of the encapsulating thin film to the display element caused by cutting may be effectively prevented when the edge is cut.

Optionally, before forming the encapsulating thin film, the method further comprises
forming a barrier between the display element and the crack extension blocking structure on the substrate.

The barrier may play a role in obstructing water vapor and oxygen.

Figure 2:
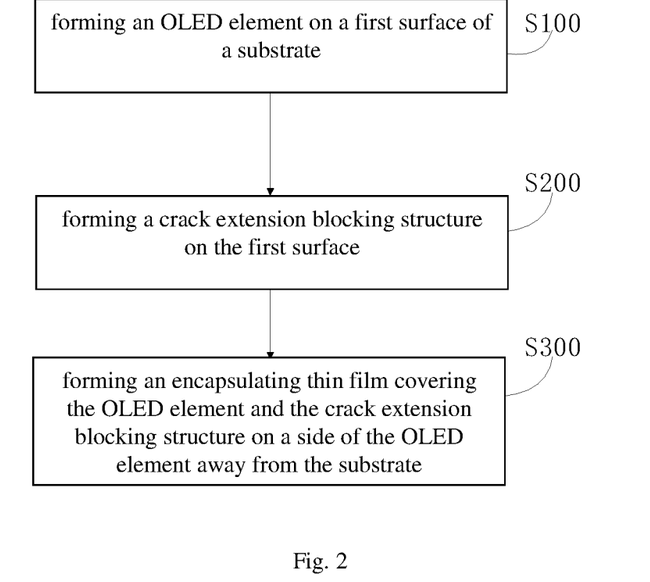
FIG. 2 is a schematic flow chart of the production of a display panel in an embodiment of this disclosure.

In one aspect of this disclosure, this disclosure provides a method of producing a display panel. According to an embodiment of this disclosure, with reference to FIG. 2, this method comprises:

S100: forming an OLED element on a first surface of a substrate.

According to an embodiment of this disclosure, a TFT array substrate is provided on a side of the substrate close to the OLED element, wherein the method of forming the TFT array substrate is a conventional technical means and is not limited hereby.

According to an embodiment of this disclosure, the step of forming the OLED element comprises conventional steps of forming a light-emitting element, an electrode, and the like, and their methods are also conventional production methods in the art and are not limited hereby.

Figure 3:
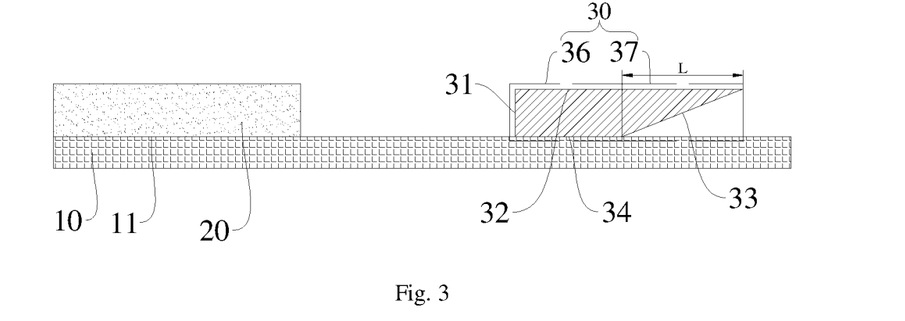
FIG. 3 is a structural schematic diagram of a display panel in another embodiment of this disclosure.

S200: forming a crack extension blocking structure 30 on the first surface 11, the crack extension blocking structure 30 is located on at least one side of the OLED element 20, the crack extension blocking structure comprises a first side wall 31, a top wall 32, a second side wall 33, and a bottom wall 34, which are sequentially connected, wherein the bottom wall 34 is provided on the first surface 11, the first side wall 31 is close to the OLED element 20, and the second side wall 33 is inclined to the first side wall 31 along a direction from the top wall 32 to the bottom wall 34. The structural schematic diagram can be referred to FIG. 3 (only a part of a display panel is shown in all structural schematic diagrams of this disclosure, and this part refers to one side in the circumference of the display panel), wherein L is the internal cutting length of the crack extension blocking structure.

According to an embodiment of this disclosure, the first side wall is close to the OLED element, the first side wall 31 may be perpendicular to the substrate (with reference to FIG. 3) or may be slightly inclined to a direction close to the second side wall so as to achieve thus the unilateral internal cutting of this crack extension blocking structure. Thereby, the adhesion of the crack extension blocking structure on the substrate may be improved to ensure that the crack extension blocking structure will not crack or peel off in subsequent processes so as to improve the reliability of the display panel.

Figure 4:
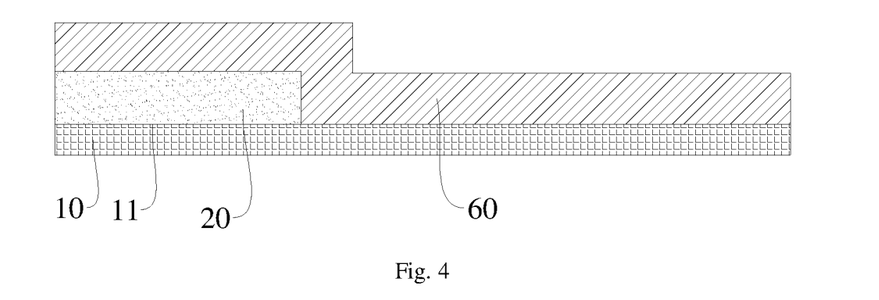
FIGS. 4-5 are structural schematic flow charts of the production of a display panel in still another embodiment of this disclosure.

According to an embodiment of this disclosure, the method of forming the crack extension blocking structure described above is not limited, and may be flexibly selected by a person skilled in the art according to practical situations. In an embodiment of this disclosure, the crack extension blocking structure is formed by using a half-tone mask plate and a negative photoresist. Specifically, steps of forming the crack extension blocking structure include:

S201: applying a negative photoresist 60, wherein the negative photoresist 60 is provided on the first surface 11 and covers the OLED element 20, with reference to FIG. 4.

According to an embodiment of this disclosure, the specific type of the negative photoresist is not limited, and any negative photoresist in the art may be selected by a person skilled in the art. This is not limited in this disclosure.

Figure 5:
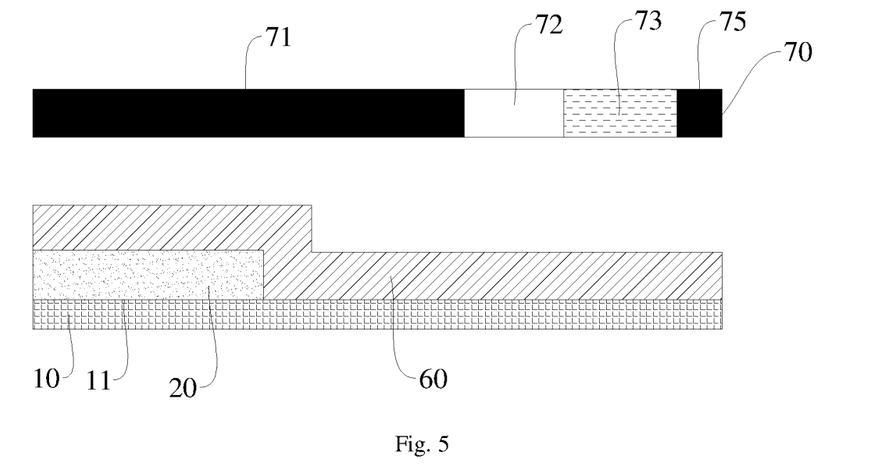

S202: performing treatments of exposure and development on the negative photoresist by using a half-tone mask plate so as to obtain the crack extension blocking structure, wherein the structural schematic diagram can be referred to FIG. 5.

Figure 6:
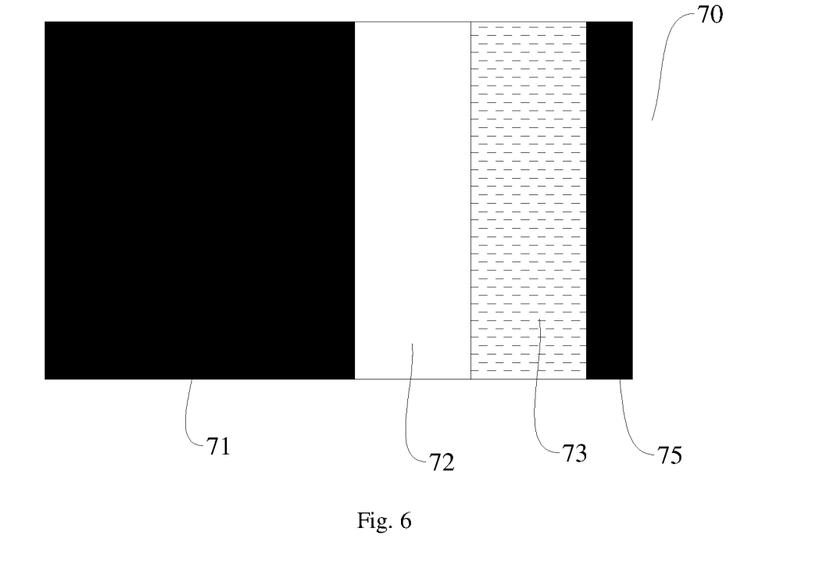
FIG. 6 is a structural schematic diagram of a half-tone mask plate in still another embodiment of this disclosure.

According to an embodiment of this disclosure, the structure of the half-tone mask plate is designed according to the design of the shape of the crack extension blocking structure. With reference to FIG. 5 and FIG. 6, the half-tone mask plate 70 comprises: a first opaque zone 71, a first fully light-transmitting zone 72, a partially light-transmitting zone 73, and a second opaque zone 75, the first fully light-transmitting zone 72 is located between the first opaque zone 71 and the partially light-transmitting zone 73, the partially light-transmitting zone 73 has a light transmittance which gradually increases along a direction from the second side wall 33 to the first side wall 31, and second opaque zone 75 is located on a side of the partially light-transmitting zone 73 away from the first fully light-transmitting zone 72, wherein the first fully light-transmitting zone 72 is used for producing a first part 36 of the crack extension blocking structure 30, the partially light-transmitting zone 73 is used for forming a second part 37 of the crack extension blocking structure 30, and wherein the first part 36 and the second part 37 constitute the crack extension blocking structure 30, an orthographic projection of the first part 36 on the substrate is overlapped with an orthographic projection of the bottom wall 34 on the substrate 10, and an orthographic projection of the second part 37 on the substrate 10 is overlapped with an orthographic projection of the second side wall 33 on the substrate 10. That is, the negative photoresist in zones corresponding to the first fully light-transmitting zone 72 and the partially light-transmitting zone 73 forms the crack extension blocking structure 30, and the structural schematic diagram can be referred to FIG. 3. Thereby, the negative photoresist in zones corresponding to the first opaque zone and the second opaque zone are completely etched off, wherein a position of the display panel corresponding to the second opaque zone is a cut zone S, the negative photoresist in a position corresponding to the first fully light-transmitting zone is completely retained, and no internally cut structure is formed on the first side wall. Since the partially light-transmitting zone 73 has a light transmittance which gradually increases along a direction from the second side wall 33 to the first side wall 31, a part of the negative photoresist in a position corresponding to the partially light-transmitting zone is retained and the thickness of the retained negative photoresist gradually decreases along a direction away from the first side wall. Therefore, the second part 37 of the partially light-transmitting zone 73 used for forming the crack extension blocking structure has a certain internal cutting length L, and this internal cutting length L is relatively long, satisfying the requirements for use and setting. Furthermore, this crack extension blocking structure is unilaterally internally cut, has a good stability, will not be crushed easily by subsequent processes such as the deposition of the encapsulating thin film and the like, and has a high reliability. Therefore, the encapsulation effect of the thin film encapsulation is improved, and the utilization performance of the display panel is further improved.

According to an embodiment of this disclosure, the magnitude of the internal cutting length L is not particularly limited, and may be flexibly set by a person skilled in the art according to practical situations such as an included angle between the second side wall and the substrate, the thickness of the crack extension blocking structure, the situation of the formation of the encapsulating thin film, and the like, as long as it is ensured that this crack extension blocking structure has a blocking effect on the encapsulating thin film. Therefore, it is ensured that the cracking of the encapsulating thin film in a cut zone will not extend to the encapsulated zone upon cutting so as to be capable of improving the encapsulation effect of the encapsulating thin film. In some embodiments of this disclosure, the internal cutting length L is 2-7 micrometers. Thereby, not only the blocking of the encapsulating thin film may be ensured, but also the stability of the crack extension blocking structure may be ensured. Additionally, a design of narrow borders of the display panel may also be achieved by this internal cutting length L.

According to an embodiment of this disclosure, the magnitude of the internal cutting length L may be controlled by adjusting the exposure amount of the partially light-transmitting zone according to characteristics of the negative photoresist. Therefore, a person skilled in the art may produce a crack extension blocking structure having a specific internal cutting length by adjusting the exposure amount of the partially light-transmitting zone according to practical demand.

According to an embodiment of this disclosure, when the internal cutting length L is relatively long, a support structure may be provided to support the crack extension blocking structure in order to further ensure that the crack extension blocking structure will not peel off and will not be crushed in subsequent processes. The specific shape of the support structure is not limited, and may be flexibly selected by a person skilled in the art according to practical demand, as long as the crack extension blocking structure may be supported and will not peel off. In some embodiments of this disclosure, with reference to FIG. 7 and FIG. 8, the crack extension blocking structure further comprises: at least one support structure 35, wherein the support structure 35 is provided between the second side wall 33 and the first surface 11 and is used for supporting the crack extension blocking structure 30. Thereby, by providing the support structure in FIG. 7, the adhesion between the crack extension blocking structure and the first surface may be increased to ensure that the crack extension blocking structure will not peel off and will not be crushed in subsequent processes such as the deposition of the encapsulating thin film and the like. The support structure in FIG. 8 may provide a supporting force to the second side wall so as to allow that the crack extension blocking structure will not peel off and will not be crushed in subsequent processes. By providing either of the two support structures described above, the reliability of the crack extension blocking structure may be improved so as to improve the reliability of the display panel and the useful life thereof. Of course, in other embodiments of this disclosure, the two support structures described above may also be provided concurrently to improve the stability of the crack extension blocking structure.

According to an embodiment of this disclosure, in order to reduce processes, the support structure and the crack extension blocking structure are integrally formed. Thereby, not only the processes are simplified and the working efficiency are improved, but also the supporting effect of the support structure on the crack extension blocking structure is better due to the integration of the support structure and the crack extension blocking structure. The forming method of integrally molding the crack extension blocking structure and the support structure is described in detail below.

Figure 9:
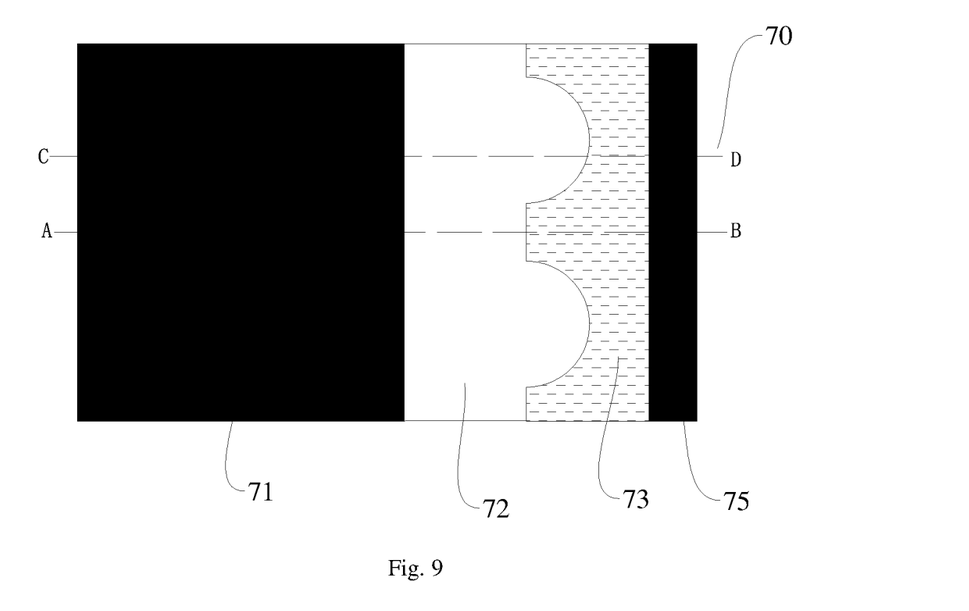
FIG. 9 is a structural schematic diagram of a half-tone mask plate in still another embodiment of this disclosure.
Figure 10:
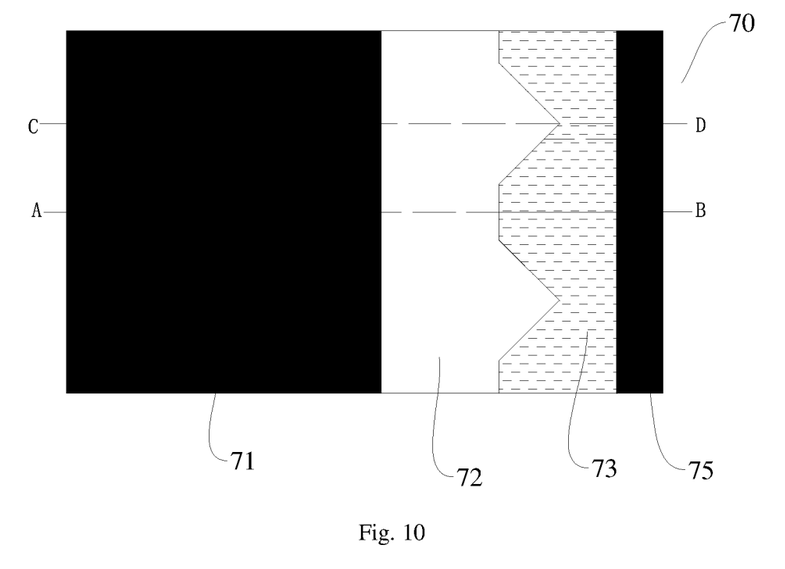
FIG. 10 is a structural schematic diagram of a half-tone mask plate in still another embodiment of this disclosure.

In some embodiments of this disclosure, with reference to FIG. 9 and FIG. 10, when the crack extension blocking structure having the support structure is being formed, the first fully light-transmitting zone 72 of the half-tone mask plate used comprises a rectangular zone and at least one projection part which is connected to the rectangular zone and protrudes to a side away from the first opaque zone, and the projection part is used for forming the support structure 35. After exposure and development, the negative photoresist in positions corresponding to the first opaque zone 71 and the second opaque zone 75 are completely etched off, and the crack extension blocking structure 30 is formed in zones corresponding to the first fully light-transmitting zone 72 and the partially light-transmitting zone 73. Here, the sectional view of the crack extension blocking structure formed at AB can be referred to FIG. 3, and the blocking structure has an internal cut with a long length at this position so as to block the encapsulating thin film to be subsequently formed. The sectional view of the crack extension blocking structure formed at CD can be referred to FIG. 7, and the support structure 35 is formed between the second side wall 33 and the first surface 11 so as to support the crack extension blocking structure 30. Particularly, since the projection part is fully light-transmitting, the negative photoresist corresponding thereto will not be etched off. That is, the photoresist corresponding to a rectangular zone and a projection part connected thereto is completely retained. In other words, the width of the bottom wall is elongated so as to increase the adhesion of the crack extension blocking structure on the first surface. The stability of the crack extension blocking structure is enhanced, and it is ensured that the crack extension blocking structure will not peel off or be crushed due to excessively long internal cutting length L in subsequent processes such as the deposition of the encapsulating thin film, so as to improve the reliability of the display panel.

According to an embodiment of this disclosure, the specific shape of the projection part is not limited, and may be flexibly selected by a person skilled in the art according to practical demand. In an embodiment of this disclosure, with reference to FIG. 9 and FIG. 10, the shape of the projection part is selected from at least one of a regular polygon (for example, a triangle), an irregular polygon, or a circular arc. Thereby, the support effecting is good and it is easy for production.

Figure 11:
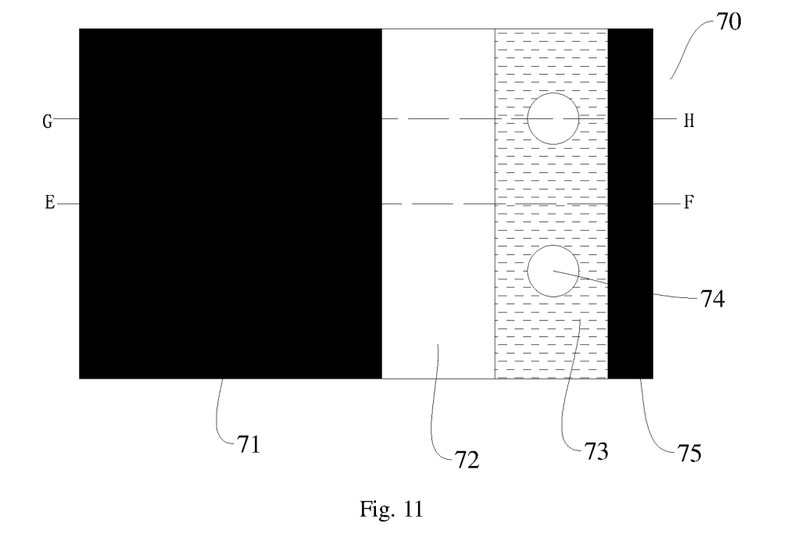
FIG. 11 is a structural schematic diagram of a half-tone mask plate in still another embodiment of this disclosure.

In other embodiments of this disclosure, with reference to FIG. 11, the half-tone mask plate 70 further comprises at least one second fully light-transmitting zone 74, the second fully light-transmitting zone 74 is surrounded by the partially light-transmitting zone 73 to form the support structure 35 of the crack extension blocking structure. Thereby, after exposure and development, the negative photoresist in positions corresponding to the first opaque zone 71 and the second opaque zone 75 are completely etched off, the negative photoresist in positions corresponding to the first fully light-transmitting zone 72 and the second fully light-transmitting zone 74 is completely retained, and the photoresist in a position corresponding to the partially light-transmitting zone 73 is partially retained. That is, the crack extension blocking structure 30 is formed in zones corresponding to the first fully light-transmitting zone 72 and the partially light-transmitting zone 73, and the support structure 35 is formed in a zone corresponding to the second fully light-transmitting zone 74. Here, the sectional view of the crack extension blocking structure formed at EF can be referred to FIG. 3, and the blocking structure has an internal cut with a long length at this position so as to block the encapsulating thin film to be subsequently formed. The sectional view of the crack extension blocking structure formed at GH can be referred to FIG. 8, and the support structure 35 is formed between the second side wall 33 and the first surface 11 so as to support the crack extension blocking structure 30. Particularly, after exposed and development, the negative photoresist corresponding to the second fully light-transmitting zone 74 will not be etched off, i.e., will be completely retained. In other words, the negative photoresist corresponding to the second fully light-transmitting zone 74 comprises a part and the support structure of the crack extension blocking structure. The support structure may provide a supporting force to the second side wall so as to allow that the crack extension blocking structure will not peel off and will not be crushed in subsequent processes such as the deposition of the encapsulating thin film and the like. The stability of the crack extension blocking structure is enhanced, and it is ensured that the crack extension blocking structure will not peel off due to excessively long internal cutting length, so as to improve the reliability of the display panel and the useful life thereof.

According to an embodiment of this disclosure, the specific shape of the second fully light-transmitting zone is not limited as long as it has a supporting effect, and may be flexibly selected by a person skilled in the art according to practical demand. In some embodiments of this disclosure, the shape of the second fully light-transmitting zone is selected from at least one of a circle, a regular polygon, or an irregular polygon. Thereby, the support effecting is good and it is easy for operation.

According to an embodiment of this disclosure, the numbers of the projection parts and the second fully light-transmitting zones are not limited, and may be flexibly selected by a person skilled in the art according to practical situations such as design requirements of the support structure. This is not limited hereby.

Figure 12:
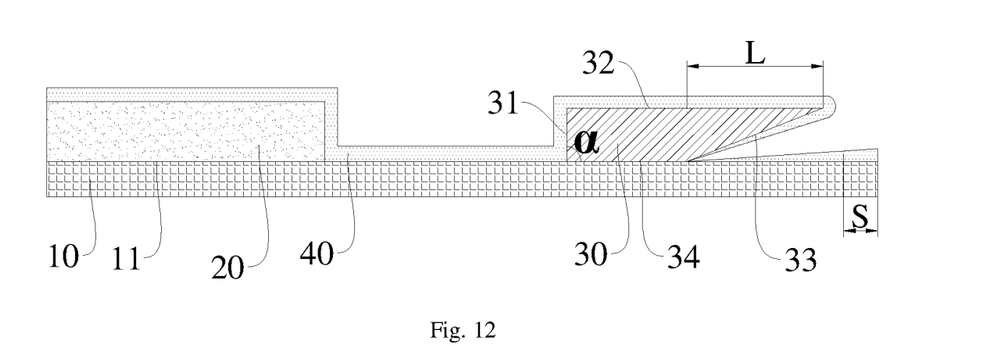
FIG. 12 is a structural schematic diagram of a display panel in still another embodiment of this disclosure.

S300: forming an encapsulating thin film 40 covering the OLED element and the crack extension blocking structure on a side of the OLED element away from the substrate, wherein the structural schematic diagram can be referred to FIG. 12. It is clear that since the internal cutting length L is relatively long, the encapsulating thin film 40 may be allowed to have a smaller thickness in a position closer to the bottom wall 34, or even disconnected, so as to achieve the effect of blocking the encapsulating thin film. In this way, when the encapsulating thin film is cut in a cut zone S, the cracking of the encapsulating thin film in the cut zone will not extend to the encapsulated zone, so as to ensure the effectiveness of encapsulation, improve the reliability of the display panel and the useful life thereof, and achieve a design of narrow borders of the display panel.

According to an embodiment of this disclosure, the method of forming the encapsulating thin film is not limited, and may be flexibly selected by a person skilled in the art according to practical demand. In some embodiments of this disclosure, the method of forming the encapsulating thin film includes but is not limited to methods such as chemical vapor deposition, physical vapor deposition, and the like. Thereby, the process is mature, and is easy for production.

The inventor has found that the method of producing the display panel described above is simple, effective, and easy for operation, has a mature process, and is ease for industrial production. Compared to a method of producing a bilaterally internally cut crack extension blocking structure in the related art, a unilaterally internally cut crack extension blocking structure may be produced in the production method of this disclosure. This unilateral internal cutting is achieved by inclining a second side wall to a first side wall along a direction from a top wall to a bottom wall. Since the first side wall is not internally cut, the contact area between the bottom wall and the substrate is increased, the adhesion therebetween is increased, and the stability of the crack extension blocking structure is improved, so as to elongate the internal cutting length of the unilateral internal cutting. It is ensured that the internal cutting is sufficient to block the encapsulating thin film, and it is ensured that the crack extension blocking structure will not easily peel off. Therefore, when the crack extension blocking structure is used, encapsulating thin films on adjacent display panels on the same motherboard may be well blocked by the crack extension blocking structure. Thus, when cutting is performed, since the crack extension blocking structure has a relatively large internal cutting length, the encapsulating thin film may be blocked in a deep position of the internal cutting. In this way, the cracking of the encapsulating thin film in a cut position will not extent to the encapsulated zone. That is, it is ensured that the cracking of the encapsulating thin film in the encapsulated zone will not occur so as to improve the encapsulation effect of the thin film encapsulation of the display panel, improve the yield rate of products, and achieve a design of narrow borders of the display panel.

Figure 13:
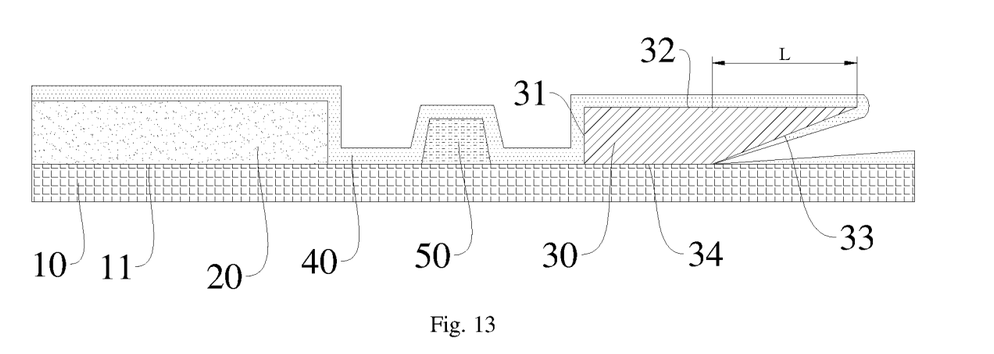
FIG. 13 is a structural schematic diagram of a display panel in still another embodiment of this disclosure.

According to an embodiment of this disclosure, the method of producing a display panel further comprises: a step of forming a barrier 50 on the first surface 11, wherein the barrier 50 is located between the OLED element 20 and the crack extension blocking structure 30 and between the first surface 11 and the encapsulating thin film 40, and the structural schematic diagram can be referred to FIG. 13. Thereby, it is possible to improve the encapsulation effect, elongate the path by which water vapor and oxygen enters the display panel, and elongate the useful life.

According to an embodiment of this disclosure, the method of forming the barrier is not limited either, and any suitable method may be flexibly selected by a person skilled in the art according to practical demand. In some embodiments of this disclosure, the method of forming the barrier includes but is not limited to methods such as application, printing, deposition, and the like. Thereby, the process is mature, and is easy for operation.

According to an embodiment of this disclosure, the number of the barriers (In FIG. 13, one barrier is merely taken as an example, rather than the limitation to the number of the barriers) and the material for forming the barrier are not limited, and may be flexibly selected by a person skilled in the art according to practical demand. This is not limited hereby.

In another aspect of this disclosure, this disclosure provides a display panel. According to an embodiment of this disclosure, with reference to FIG. 12, this display panel comprises: a substrate 10; an OLED element 20, wherein the OLED element 20 is provided on a first surface 11 of the substrate 10; a crack extension blocking structure 30, wherein the crack extension blocking structure 30 is provided on the first surface 11 and located on at least one side of the OLED element 20, and the crack extension blocking structure comprises a first side wall 31, a top wall 32, a second side wall 33, and a bottom wall 34, which are sequentially connected, wherein the bottom wall 34 is provided on the first surface 11, the first side wall 31 is close to the OLED element 20, and the second side wall 33 is inclined to the first side wall 31 along a direction from the top wall 32 to the bottom wall 34; and an encapsulating thin film 40, wherein the encapsulating thin film 40 is provided on a side of the OLED element 20 away from the substrate 10 and covers the OLED element 20 and the crack extension blocking structure 30. The inventor has found that compared to bilaterally internally cut crack extension blocking structures in the related art, the crack extension blocking structure of this disclosure is unilaterally internally cut, which is achieved by inclining a second side wall to a first side wall along a direction from a top wall to a bottom wall. Since the first side wall is not internally cut, the contact area between the bottom wall and the substrate is increased, the adhesion therebetween is increased, and the stability of the crack extension blocking structure is improved so as to elongate the internal cutting length L of the unilateral internal cutting. It is ensured that the internal cutting is sufficient to block the encapsulating thin film, and it is ensured that the crack extension blocking structure will not easily peel off. Therefore, when the crack extension blocking structure is used, encapsulating thin films on adjacent display panels on the same motherboard may be well blocked by the crack extension blocking structure. Thus, when cutting is performed in a cut zone S, since the crack extension blocking structure has a relatively large internal cutting length L, the encapsulating thin film may be blocked in a deep position of the internal cutting. In this way, the cracking of the encapsulating thin film in the cut zone S will not extent to the encapsulated zone. That is, it is ensured that the cracking of the encapsulating thin film in the encapsulated zone will not occur so as to improve the encapsulation effect of the thin film encapsulation of the display panel, improve the yield rate of products, and achieve a design of narrow borders of the display panel.

According to an embodiment of this disclosure, the specific type of the substrate formed is not limited, and may be flexibly selected by a person skilled in the art according to practical demand. In some embodiments of this disclosure, the specific type of the substrate formed includes but is not limited to a polymer substrate, a glass substrate, or a metal substrate. According to an embodiment of this disclosure, a TFT array substrate is provided on a side of the substrate close to the OLED element, wherein the method of forming the TFT array substrate is a conventional technical means and is not limited hereby.

It is to be indicated that the OLED element here may comprise at least one of a light-emitting layer, electrodes provided on both sides of the light-emitting layer, and at least one of an electron injection layer, an electron transport layer, a hole injection layer, and a hole transport layer. According to an embodiment of this disclosure, the step of forming the OLED element comprises conventional steps of forming a light-emitting layer, an electrode, and the like, and their methods are also conventional production methods in the art and are not limited hereby.

According to an embodiment of this disclosure, the structure for forming the encapsulating thin film is not limited, and may be flexibly selected by a person skilled in the art according to practical demand. In some embodiments of this disclosure, the encapsulating thin film is an inorganic thin film or a combination of several layers of inorganic thin films. In other embodiments of this disclosure, the encapsulating thin film is an organic thin film or a combination of several layers of organic thin films. In still other embodiments of this disclosure, the encapsulating thin film is a combination in which an inorganic layer, an organic layer, an inorganic layer, an organic layer, and the like, are sequentially provided by lamination. Thereby, the structure of the encapsulating thin film may be selected according to practical demand to improve the encapsulation effect. According to an embodiment of this disclosure, the material for forming the organic layer (an organic thin film) and the inorganic layer (an inorganic thin film) is not limited, and may be flexibly selected by a person skilled in the art according to practical demand. In some embodiments of this disclosure, the material for forming the inorganic layer includes but is not limited to silicon nitride, silicon carbide, aluminum oxide, silicon dioxide, silicon oxynitride, fluoride, and the like; and the material for forming the organic layer includes but is not limited to polyimide, poly(methyl methacrylate), epoxy resins, polyethylene terephthalate, polyethylene naphthalate, polycarbonate, polyimide, polyethylene sulfonates, polyformaldehyde, polyarylate, hexamethyldisiloxane, and the like.

According to an embodiment of this disclosure, with reference to FIG. 12, the first side wall is close to the OLED element and has an included angle α of less than or equal to 90 degrees with the bottom wall 34. That is, the first side wall may be perpendicular to the substrate (with reference to FIG. 12) or may be slightly inclined to a direction close to the second side wall. However, in order to ensure the stability of the crack extension blocking structure, the inclination should not be excessively large, and slight inclination is enough. The specific inclination is not limited, and may be flexibly set by a person skilled in the art according to practical demand. Thereby, the adhesion of the crack extension blocking structure on the substrate may be improved to ensure that the crack extension blocking structure will not crack or peel off in subsequent processes so as to improve the reliability of the display panel.

According to an embodiment of this disclosure, the magnitude of the internal cutting length L is not particularly limited, and may be flexibly set by a person skilled in the art according to practical situations, such as an included angle between the second side wall and the substrate, the thickness of the crack extension blocking structure, the situation of the formation of the encapsulating thin film, and the like, as long as it is ensured that this crack extension blocking structure has a blocking effect on the encapsulating thin film. Therefore, it is ensured that the cracking of the encapsulating thin film in a cut zone will not extend to the encapsulated zone upon cutting so as to be capable of improving the encapsulation effect of the encapsulating thin film. In some embodiments of this disclosure, the internal cutting length L is 2-7 micrometers. Thereby, not only the blocking of the encapsulating thin film may be ensured, but also the stability of the crack extension blocking structure may be ensured. Additionally, a design of narrow borders of the display panel may also be achieved by this internal cutting length L.

According to an embodiment of this disclosure, the size of the bottom wall is not limited either, as long as the crack extension blocking structure may be stably attached onto the first surface to ensure the stability of the crack extension blocking structure. This is not limited hereby.

According to an embodiment of this disclosure, a support structure may be provided to support the crack extension blocking structure in order to further ensure that the crack extension blocking structure will not peel off and will not be crushed in subsequent processes when the internal cutting length L is relatively long. In some embodiments of this disclosure, with reference to FIG. 7 and FIG. 8, the crack extension blocking structure further comprises: at least one support structure 35, wherein the support structure is provided between the second side wall 33 and the first surface 11 and is used for supporting the crack extension blocking structure 30. Thereby, by providing the support structure in FIG. 7, the adhesion between the crack extension blocking structure and the first surface may be increased to ensure that the crack extension blocking structure will not peel off and will not be crushed in subsequent processes. The support structure in FIG. 8 may provide a supporting force to the second side wall so as to allow that the crack extension blocking structure will not peel off and will not be crushed in subsequent processes. That is, by providing the support structure, the reliability of the crack extension blocking structure may be improved so as to improve the reliability of the display panel and the useful life thereof. Of course, in other embodiments of this disclosure, the two support structures described above may be provided concurrently to improve the stability of the crack extension blocking structure.

Figure 7:
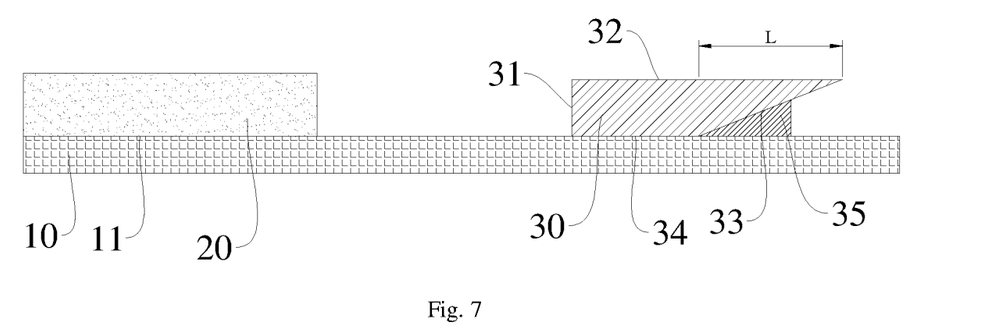
FIG. 7 is a structural schematic diagram of a display panel in still another embodiment of this disclosure.
Figure 8:
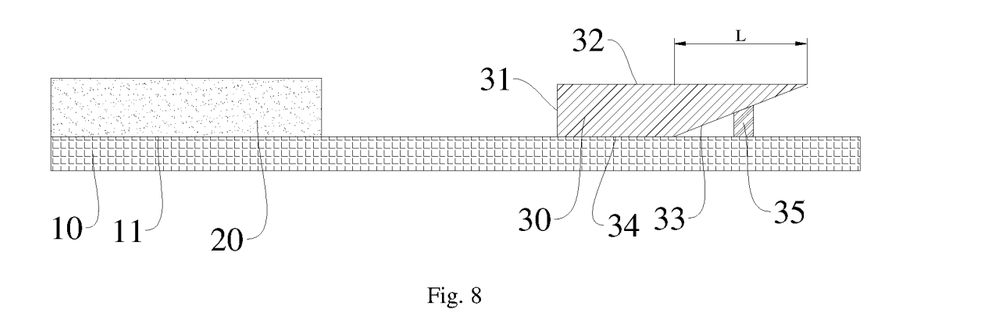
FIG. 8 is a structural schematic diagram of a display panel in still another embodiment of this disclosure.

According to an embodiment of this disclosure, the support structure is provided between the second side wall and the first surface, as described previously. That is, the support structure 35 covers at least one part of the second side wall 33. However, it is to be indicated that in order to ensure that the crack extension blocking structure may block the encapsulating thin film, its internal cutting length L has a certain depth, and therefore the support structures are distributed at intervals rather than continuously provided on the entire second side wall. According to an embodiment of this disclosure, the condition of the distribution of the support structures is not limited either, and the support structures may be evenly distributed or may be unevenly distributed, as long as the supporting effect on the crack extension blocking structure can be achieved. This is not limited hereby either.

According to an embodiment of this disclosure, the shape of the support structure is not limited, and may be flexibly set by a person skilled in the art according to practical demand. In some embodiments of this disclosure, the support structure may be a slope-like structure as shown in FIG. 7. In other embodiments of this disclosure, the support structure may be a cylindrical structure as shown in FIG. 8, and the support structure covers a part of the second side wall. In still other embodiments of this disclosure, there may be the two support structures described above concurrently in the same display panel.

According to an embodiment of this disclosure, the number of the support structures is not limited, the number of the support structures may be flexibly designed by a person skilled in the art according to factors such as the adhesion between the crack extension blocking structure and the substrate, the size of the bottom wall, and the like. This is not limited hereby.

According to an embodiment of this disclosure, in order to reduce processes, the support structure and the crack extension blocking structure are integrally formed. Thereby, not only the processes are simplified and the working efficiency are improved, but also the supporting effect of the support structure on the crack extension blocking structure is better due to the integration of the support structure and the crack extension blocking structure.

According to an embodiment of this disclosure, in order to improve the encapsulation effect of the display panel and elongate the path by which water vapor and oxygen enters the display panel, the display panel further comprises a barrier 50 with reference to FIG. 13, wherein the barrier 50 is provided on the first surface 11 and located between the OLED element 20 and the crack extension blocking structure 30 and between the first surface 11 and the encapsulating thin film 40. Thereby, the encapsulation effect of the display panel is improved, the path by which water vapor and oxygen enters the display panel is elongated, and the useful life is elongated.

According to an embodiment of this disclosure, the method described above may be used to produce this display panel, wherein the setting requirements for the OLED element, the method of forming the encapsulating thin film, the number of the barriers and the method of forming the barrier, the method of forming the support structure, and the method of forming the crack extension blocking structure are consistent with those described previously. Verbose words are omitted herein.

In still another aspect of this disclosure, this disclosure provides a display apparatus. According to an embodiment of this disclosure, this display apparatus comprises the display panel described previously. Thereby, this display panel has a high utilization performance, a good reliability, a long useful life, and a strong market competitiveness. It can be understood by a person skilled in the art that this display apparatus has all characteristics and advantages of the display panel described previously. Verbose words are omitted herein.

According to an embodiment of this disclosure, the specific type of this display apparatus is not particularly limited, and may be any apparatus or device having a display function, for example, including but not limited to cell phones, tablet computers, computer displays, game consoles, televisions, display screens, wearable devices, other living appliances or domestic appliances having a display function, and the like.

Of course, it can be understood by a person skilled in the art that the display apparatus of this disclosure may further comprise essential structures and members possessed by a conventional display apparatus, in addition to the display panel described previously. Illustration is made by taking a cell phone as an example, and it may further have structures and members possessed by a conventional cell phone such as a touch screen, a case, a CPU, a photographic module, a fingerprint recognition module, a sound processing system, and the like, in addition to the display panel of this disclosure. Verbose words are omitted herein.

In the description of this disclosure, it is to be understood that orientations and positional relationships indicated by terms "center", "longitudinal", "lateral", "length", "width", "thickness", "on", "under", "before", "after", "left", "right", "vertical", "horizontal", "top", "bottom", "in", "out", "clockwise", "anticlockwise", "axial", "radial", "circumferential", and the like, are based on orientations or positional relationships as shown in figures. They are merely intended to facilitate the description of this disclosure and simplify the description, but do not indicate or imply that indicated apparatuses or elements necessarily have specific orientations and are configured and operated in specific orientations. Therefore, they may not be understood as limit to this disclosure.

Furthermore, terms "first" and "second" are for the purpose of description only, and cannot be understood as indicating or suggesting relative importance or implying the number of technical features indicated. Thereby, a characteristic defined by "first" and "second" may expressly or impliedly comprises one or more characteristics. In the description of this disclosure, "A plurality of" means two or more, unless specifically defined otherwise.

In this disclosure, terms such as "mount", "associate", "connect", "fix", and the like should be understood in the broadest sense. For example, it may be fixed connection, detachable connection, or integration; may be mechanical connection or electrical connection; may be direct connection or indirect connection via an intermediate medium; may be internal communication of two elements or interaction of two elements. The specific meanings of the terms described above in this disclosure may be understood by those of ordinary skill in the art according to specific circumstances.

In this disclosure, a first characteristic is "on" or "under" a second characteristic may be that the first and second characteristics are in direct contact or the first and second characteristics are in indirect contact via an intermediate medium, unless specifically specified and defined otherwise. Additionally, the first characteristic is "on", "above", and "over" the second characteristic may be that the first characteristic is directly above or inclinedly above the second characteristic, or merely means that the horizontal height of the first characteristic is higher than that of the second characteristic. Additionally, the first characteristic is "under", "below", and "beneath" the second characteristic may be that the first characteristic is directly below or inclinedly below the second characteristic, or merely means that the horizontal height of the first characteristic is smaller than that of the second characteristic.

In the description of this specification, the description with reference to terms "one embodiment", "some embodiments", "an example", "a specific example", or "some examples", and the like means that specific characteristics, structures, materials, or features described in conjunction with this embodiment or example are included in at least one embodiment or example of this disclosure. In this specification, the illustrative expression of the above terms is not necessarily directed to the same embodiment or example. Additionally, the specific characteristics, structures, materials, or features described may be conjoined in any one or several embodiment(s) or example(s) in a suitable manner. Furthermore, different embodiments or examples described in this specification and characteristics in different embodiments or examples may be conjoined and combined by a person skilled in the art without contradiction.

Although the embodiments of this disclosure are illustrated and described above, it can be appreciated that the embodiments described above are exemplary and cannot be understood as limiting this disclosure. Alternations, modifications, substitution, and variations may be made to the embodiments described above by those of ordinary skill in the art in the scope of this disclosure.

What is claimed is:

1. A display panel, comprising:
    a substrate,
    a crack extension blocking structure used for a thin film encapsulation in the display panel, wherein the crack extension blocking structure has a first side wall, a top wall, a second side wall, and a bottom wall, which are sequentially connected, wherein the bottom wall is adjacent to the substrate, wherein the second side wall is inclined to the first side wall along a direction from the top wall to the bottom wall, and an included angle between the first side wall and the bottom wall is less than or equal to 90 degrees,
    a display element, and
    an encapsulating thin film,
    wherein the display element is on the substrate, the first side wall of the crack extension blocking structure is closer to the display element than the second side wall, and the display element and the crack extension blocking structure are encapsulated on the substrate by the encapsulating thin film.

2. The display panel according to claim 1, wherein the display panel further comprises a barrier, which is on the substrate, between the display element and the crack extension blocking structure, and encapsulated by the encapsulating thin film.

3. The display panel according to claim 1, wherein the encapsulating thin film is disconnected at a junction of the second side wall and the substrate.

4. A display apparatus, comprising the display panel according to claim 1.

5. A method of producing a crack extension blocking structure used for a thin film encapsulation in a display panel, wherein the crack extension blocking structure has a first side wall, a top wall, a second side wall, and a bottom wall, which are sequentially connected, wherein the bottom wall is adjacent to a substrate of the display panel, wherein the second side wall is inclined to the first side wall alone a direction from the top wall to the bottom wall, and an included angle between the first side wall and the bottom wall is less than or equal to 90 degrees, wherein the method comprises:

forming a negative photoresist layer on the substrate;

exposing the negative photoresist layer by using a half-tone mask plate, wherein the half-tone mask plate comprises an opaque zone, a fully light-transmitting zone, and a partially light-transmitting zone having a gradually changed light transmittance, so as to form an unexposed zone, a fully exposed zone, and a partially exposed zone having a gradually changed exposure amount therein in the negative photoresist layer; and developing the negative photoresist layer to produce the crack extension blocking structure, wherein the negative photoresist in the unexposed zone is completely removed, the negative photoresist in the fully exposed zone is retained, and the unexposed negative photoresist between the exposed negative photoresist and the substrate in the partially exposed zone is removed to form the second side wall of the crack extension blocking structure.

6. The method according to claim 5, wherein the fully light-transmitting zone comprises a protrusion zone which protrudes into the partially light-transmitting zone, and the protrusion zone is subjected to the exposing and developing to form a support part, which is between the second side wall and the substrate and used to support the second side wall.

7. The method according to claim 6, wherein the protrusion zone comprises at least one of a regular polygon, an irregular polygon, or a circular arc.

8. The method according to claim 5, wherein the fully light-transmitting zone comprises an island zone in the partially light-transmitting zone, and the island zone is subjected to the exposing and developing to form a support part, which is between the second side wall and the substrate and used to support the second side wall.

9. The method according to claim 8, wherein the island zone has a shape selected from at least one of a circle, a regular polygon, or an irregular polygon.

10. A method of producing a display panel, comprising:

forming a display element on a substrate, producing the crack extension blocking structure by the method according to claim 5, and forming an encapsulating thin film to encapsulate the display element and the crack extension blocking structure on the substrate, wherein the first side wall of the crack extension blocking structure is closer to the display element than the second side wall.

11. The method according to claim 10, wherein the encapsulating thin film is formed to be disconnected at a junction of the second side wall and the substrate.

12. The method according to claim 10, wherein the encapsulating thin film is formed by CVD.

13. The method according to claim 10, further comprising cutting the encapsulating thin film outside the second side wall.

14. The method according to claim 10, wherein before forming the encapsulating thin film, the method further comprises forming a barrier between the display element and the crack extension blocking structure on the substrate.

15. The display panel according to claim 1, wherein the crack extension blocking structure further comprises:

at least one support part, which is between the second side wall and the substrate and used to support the second side wall.

16. The display panel according to claim 15, wherein the support part and the second side wall are integrally formed.

* * * * *